United States Patent [19]

Schlichte

[11] 3,906,489

[45] Sept. 16, 1975

[54] DIGITAL-TO-ANALOG CONVERTER

[75] Inventor: Max Schlichte, Munich, Germany

[73] Assignee: Siemens Aktiengesellschaft, Munich, Germany

[22] Filed: Mar. 28, 1974

[21] Appl. No.: 455,664

[30] Foreign Application Priority Data

Mar. 30, 1973 Germany ........................... 2315986

[52] U.S. Cl. ........................................ 340/347 DA
[51] Int. Cl. ........................................ H03k 13/04
[58] Field of Search ............................ 340/347 DA

[56] References Cited

UNITED STATES PATENTS

| | | | |
|---|---|---|---|
| 2,827,233 | 3/1958 | Johnson et al. | 235/61 |
| 3,562,743 | 2/1971 | Lerouge et al. | 340/347 |
| 3,582,941 | 6/1971 | LeMauot et al. | 340/347 |
| 3,728,719 | 4/1973 | Fish | 340/347 DA |
| 3,735,264 | 5/1973 | Maudvech | 325/38 |

*Primary Examiner*—Malcolm A. Morrison
*Assistant Examiner*—Vincent J. Sunderdick
*Attorney, Agent, or Firm*—Schuyler, Birch, Swindler, McKie & Beckett

[57] ABSTRACT

A digital-to-analog converter is described. Only one resistor-ladder network is used to achieve a non-linear characteristic when converting a digital signal to an analog signal. One group of the bits of the digital signal that fixes a signal amplitude controls the supply of a constant current to a corresponding number of adjacent junction points or nodes between one leakage resistor and at least one shunt resistor of the resistor-ladder network. Another group of the bits determines the positions of the junction points suitable for the supply of a constant current relative to an outlet terminal of the ladder network. The invention is employed in an analog-to-digital coder operating according to the iterative process.

5 Claims, 3 Drawing Figures

DIGITAL-TO-ANALOG CONVERTER

BACKGROUND OF THE INVENTION

The invention relates to a digital-to-analog converter for converting digital signals comprising $n+m+1$ bits each to analog signals with a non-linear bend characteristic consisting of $2^{m+1}$ linear segments with $2^n$ amplitude stages each. More particularly, the invention has application in a decoder operating according to the iterative process through the use of a first decoder circuit element, a second decoder circuit element, and a third decoder circuit element, whereby the first decoder circuit element converts the least significant n bits of the digital signal concerned in a resistor network with resistors that are adequate for a binary staggering of values into an analog control signal for the second decoder circuit element. In the resistor network of the first decoder circuit element a further resistor can be made operative in the event that at least one of the m bits of the digital signal concerned immediately preceding the n bits in significance is formed by a binary 1. The second decoder circuit component comprises a resister-ladder network having resistors that are adequate for a binary staggering of values. The latter resistors are capable of being made operative according to the value of the m binary-1 bits of the digital signal concerned, and by which said control signal is affected accordingly. In the third decoder circuit element the polarity of an output signal to be transmitted from the second decoder circuit element to a decoder output is determined by the remaining bit in the digital signal in question.

A digital-to-analog converter of the type referenced above is old in the art (West German Unexamined Patent Specification No. 2,011,056). In the prior art digital-to-analog converter there is employed for the processing of the n bits of the digital signals each comprising n-m-1 bits either a resistor network whose resistors (resistance values: 2R, 4R, 8R or 16R), which are adequate for a binary staggering of values, can selectively be connected to a reference voltage, or a resistor network in the form of a ladder network in $\mu$ circuit. All the shunt resistors in the foregoing network have the resistance value R and all the leakage resistors the resistance value 2R.

A loss-resistance network is used for the second decoder circuit element in the prior digital-to-analog converter comprising resistors with values varying from R to 32R. The individual resistors of the loss-resistance network are made operative according to the value of the $m$ binary-1 bits of the digital signal concerned.

The one bit still available in the digital signal concerned in addition to said $n$ and $m$ bits is called upon either to provide in the first decoder circuit element a reference voltage of one or another polarity or the bit in question is called upon, where necessary, to switch on or off inverter stages provided on the output of the first decoder circuit element. Thus, depending on whether the one bit in question is a 1 or a 0 bit, there appears on the output of the first decoder circuit element and, therefore, on the converter output, a positive or a negative analog signal. However, although the digital-to-analog converter described above enables the conversion of digital signals, each comprising $n+m+1$ bits, into analog signals, whereby use is made of a non-linear bend characteristic, such as the 13-segment compandor characteristic (see FIG. 1 of West German Unexamined Patent Specification No. 2,011,056) used for the PCM coding or decoding according to the CCITT recommendations (contrast with COM XV, question 33, Temp. Doc. No. 34 of Sept. 25 to Oct. 6, 1967, published by the CCITT), the construction of the first decoder circuit element and of the second decoder circuit element is relatively complex.

It is, therefore, an object of the invention to provide a simplified construction of a digital-to-analog converter of the type referenced hereinabove.

SUMMARY OF THE INVENTION

In accordance with the invention, the foregoing and other objects are achieved in that, starting from a digital-to-analog converter of the type mentioned above, the first and the second decoder circuit elements contain a shared resistor-ladder network, all of whose shunt resistors and resistors disposed at both ends of the ladder network each have one and the same resistance value. All other resistors disposed in the leakage paths of the resistor-ladder network have twice the resistance value. From one end of the resistor-ladder network a group of n adjacent junction points formed by one leakage resistor and at least one shunt resistor each can be energized with a constant current in accordance with the $n$ binary-1 bits of the digital signal concerned. The junction point formed by the leakage resistor and two shunt resistors and adjoining the n junction points can be energized with a constant current in the event that at least one bit of the m bits of the digital signal concerned is formed by a binary 1. The decoder output can selectively be connected between one leakage resistor and at least one shunt resistor with one of $2^m-1$ junction points adjoining the junction points, whereby the junction point concerned is fixed by the value of the $m$ binary-1 bits of the digital signal concerned.

In accordance with the invention, using as a basis a digital-to-analog converter of the type mentioned hereinabove the first and second decoder circuit element shares a common resistor-ladder network, all of whose shunt resistors and resistors disposed at both ends of the ladder network each have one and the same resistance value. One end of the resistor-ladder network is connected to a decoder outlet. Constant currents can selectively be routed to a group of n neighboring junction pôints formed by one leakage resistor and at least one shunt resistor each according to the $n$ binary-1 bits of the digital signal concerned. One junction point of the group of n neighboring junction points turned toward the one end of the resistor-ladder network has a distance, from the end in question, corresponding to 1 to $2^{m-1}$ junction points in accord with the value of the $m$ binary-1 bits of the digital signal concerned. A constant current is fed to the junction point between one leakage resistor and at least one shunt resistor adjoining the $n$ neighboring junction points in the direction of the one end of the resistor-ladder network in the event that at least one of the m bits of the digital signal concerned is formed by a binary 1.

Compared with the prior art digital-to-analog converter referenced above, the invention has the advantage that a combination of the first and second decoder circuit element and, therewith, an extremely simple construction is possible with comparatively little technical effort, so that integrated circuit techniques can be applied. Also, the invention has the advantage that in the case of the two aforesaid decoder circuit elements one can manage with resistors having only two different resistance values, which is a greater convenience, from the manufacturing point of view. The invention, likewise, has the advantage that permissible variations in the resistances of the resistor-ladder network only have a negligible effect on the accuracy of the conversion of digital signals to analog signals. An error propagation such as occurs in the prior art loss-resistance network described above is not possible here.

According to an advantageous development of the invention, the constant currents can be connected to the relevant junction points between one leakage resistor and at least one shunt resistor over a switch network containing a multiplicity of switches which can be triggered from an output of a control decoder having $2^m$ outputs, to which are fed the m bits of the relevant digital signal. This results in the advantage that the individual junction points between one leakage resistor and at least one shunt resistor of the resistor-ladder network can be triggered very easily.

According to a further development of the invention, the polarities of the constant currents occurring are determined by the remaining one bit of the relevant digital signal, so it is relatively easy to transmit signals from the actual digital-to-analog converter with the appropriate polarity required in each case.

According to another advantageous development of the invention, there is inserted intermediate the decoder output and the resistor-ladder network a changeover stage, which transmits with one or another polarity the signal routed thereto as a function of the value of the remaining one bit of the digital signal concerned.

Thus, the operation can be performed with constant currents of one polarity, which is of advantage in the event that the only constant-current sources provided are capable of generating constant currents of one polarity.

BRIEF DESCRIPTION OF THE DRAWINGS:

The principles of the invention will be more readily understood by reference to the description of preferred embodiments given hereinbelow in conjunction with the accompanying drawings, wherein.

Figure 1:
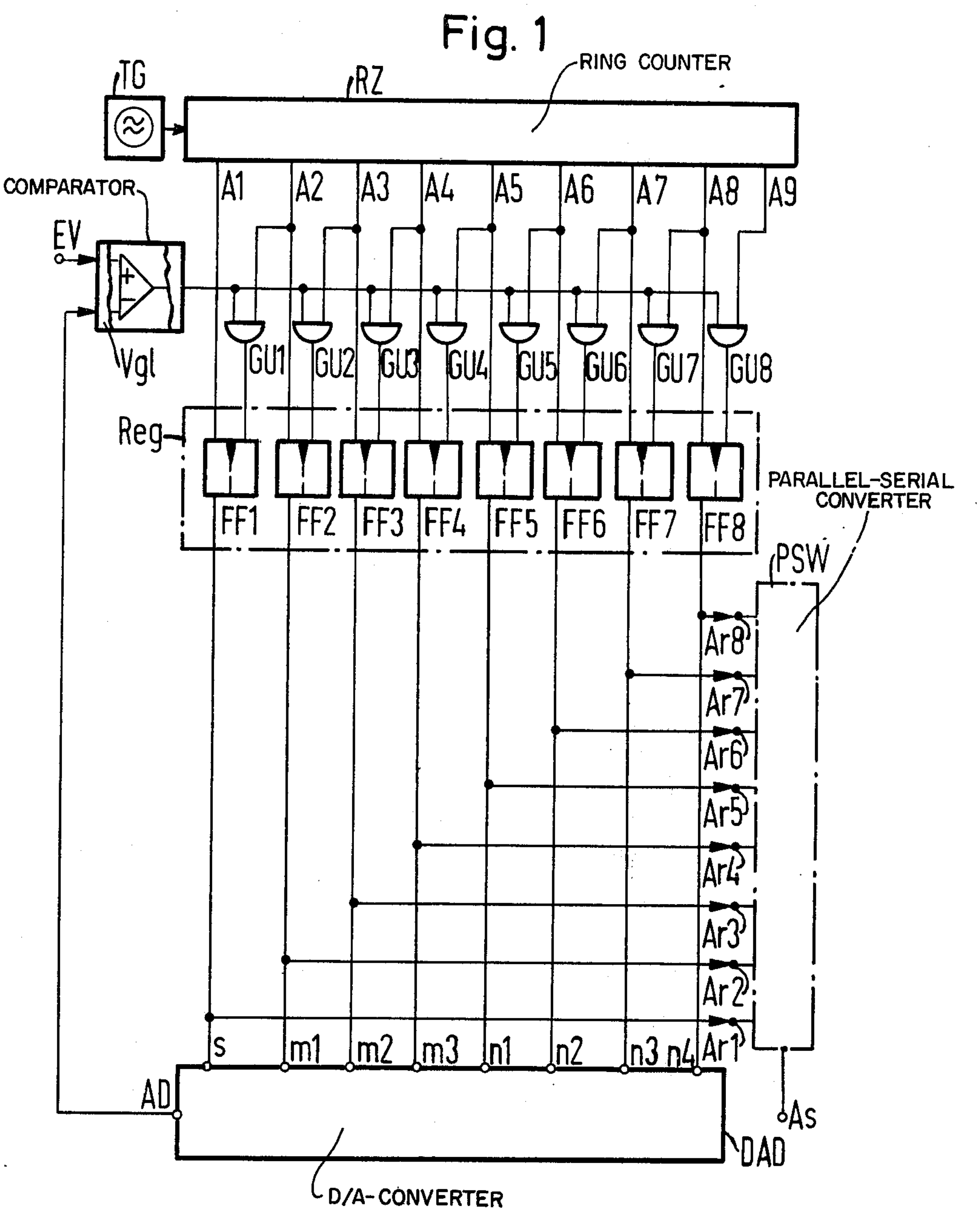
FIG. 1 is a block diagram of a coder operating according to the iterative process, in which the digital-to-analog converter constructed according to the invention can be employed.

DETAILED DESCRIPTION OF THE DRAWINGS:

The coder in FIG. 1, which operates according to the iterative process, comprises an input stage formed by a comparator $Vg1$, to which input stage are fed at an input EV analog signals to be converted to digital signals. The comparator $Vg1$ is a comparator that operates in analog fashion for comparing the analog input signal available at the input EV with another analog signal fed thereto at another input (not designated). At the output of the comparator $Vg1$ are connected with one input each 8 AND elements GU1, GU2, GU3, GU4, GU5, GU6, GU7, and GU8. The other inputs of said AND elements GU1 to GU8 are connected to outputs A2, A3, A4, A5, A6, A7, A8 or A9 of a ring counter RZ. The ring counter is so controlled from a clock generator TG that it transmits a signal to each of its outputs sequentially, one after another. The outputs of the AND elements GU1 to GU8 are connected at reset inputs of flip-flops FF1, FF2, FF3, FF4, FF5, FF6, FF7 or FF8, which form a register Reg. The set inputs of flip-flops FF1 to FF8 are connected at the outputs A1 to A8 of the ring counter.

A digital-to-analog converter DAD is connected to inputs $s$, $m1$, $m2$, $m3$, $n1$, $n2$, and $n4$ to the outputs of the flip-flops FF1 to FF8 associated with the set inputs. An output AD of the digital-to-analog converter DAD is connected with the aforesaid other input of the comparator $Vg1$. A parallel-serial converter PSW is further connected with its inputs $Ar1$ to $Ar8$ to the outputs of the flip-flops FF1 to FF8. As will be explained hereinbelow, there appear at said inputs, after each operating cycle of the ring counter, the bits of a digital signal corresponding to the analog input signal appearing at the input EV.

The parallel-serial converter PSW is capable of transmitting, as serial bits, from an output $As$, the bits routed thereto substantially in parallel fashion. For this purpose, the output As of the parallel-serial converter PSW could simply be connected to all inputs $Ar1$ to $Ar8$ of the parallel-serial converter PSW — here via decoupling switching means, such as diodes.

After describing the construction of the coder of FIG. 1, its mode of operation will now be described. Let it first be assumed that all the flip-flops FF1 to FF8 are in the reset state in which a 0 is transmitted from its outputs, as wired in FIG. 1. Let it now be assumed that an analog input signal is applied at the input EV and the the clock generator TG, transmits clock pulses to the ring counter RZ, which may be in such a position that a signal appears at the output A1, upon the appearance of the first clock pulse from the clock generator TG. This signal causes the flip-flop FF1 to be set, which, in turn, causes the feeding of a 1 bit to the input $s$ of the digital-to-analog converter DAD, whereupon a corresponding analog signal is transmitted to the comparator $Vg1$ from the output AD of said converter DAD.

In this comparator $Vg1$, the analog signal concerned is compared with the analog input signal still applied at the input EV, whereby, as a result of this comparison, an output signal can be transmitted indicating that the analog input signal concerned is greater than the analog signal applied at the other input of the comparator $Vg1$. As a result, with the appearance of the following signal from the ring counter RZ, that is, a signal at the output A2 of the ring counter RZ, the AND element GU1 can be disabled for transmission, so that the flip-flop FF1 remains set. Moreover, the flip-flop FF2 is set by the signal now appearing at the output A2 of the ring counter RZ, so that an additional 1 bit is routed to the input $m1$ of the digital-to-analog converter DAD.

The procedure following immediately thereafter corresponds to the one explained hereinabove, it now being assumed that the comparator $Vg1$ transmits an output signal indicating that the analog input signal applied at the input EV is smaller than the analog signal fed to the other input from the output AD of the digital-to-analog converter DAD. As a result, the appearance of a signal at the output A3 of the ring counter RZ enables the AND element GU2 for transmission, so that the flip-flop FF2 is again reset. Also, the flip-flop FF2 is set at this stage, now transmitting a 1 bit to the input *m*2 of the digital-to-analog converter DAD. In the manner described hereinabove, the analog input signal applied at the input EV is compared in steps with corresponding analog signals transmitted from the output AD of the digital-to-analog converter DAD until finally a signal is transmitted from the output A9 of the ring counter RZ. At this instant, the flip-flops FF1 to FF8 of the register R*eg* are in positions that correspond to the bits of a digital signal corresponding to the analog input signal applied at the input EV.

Figure 2:
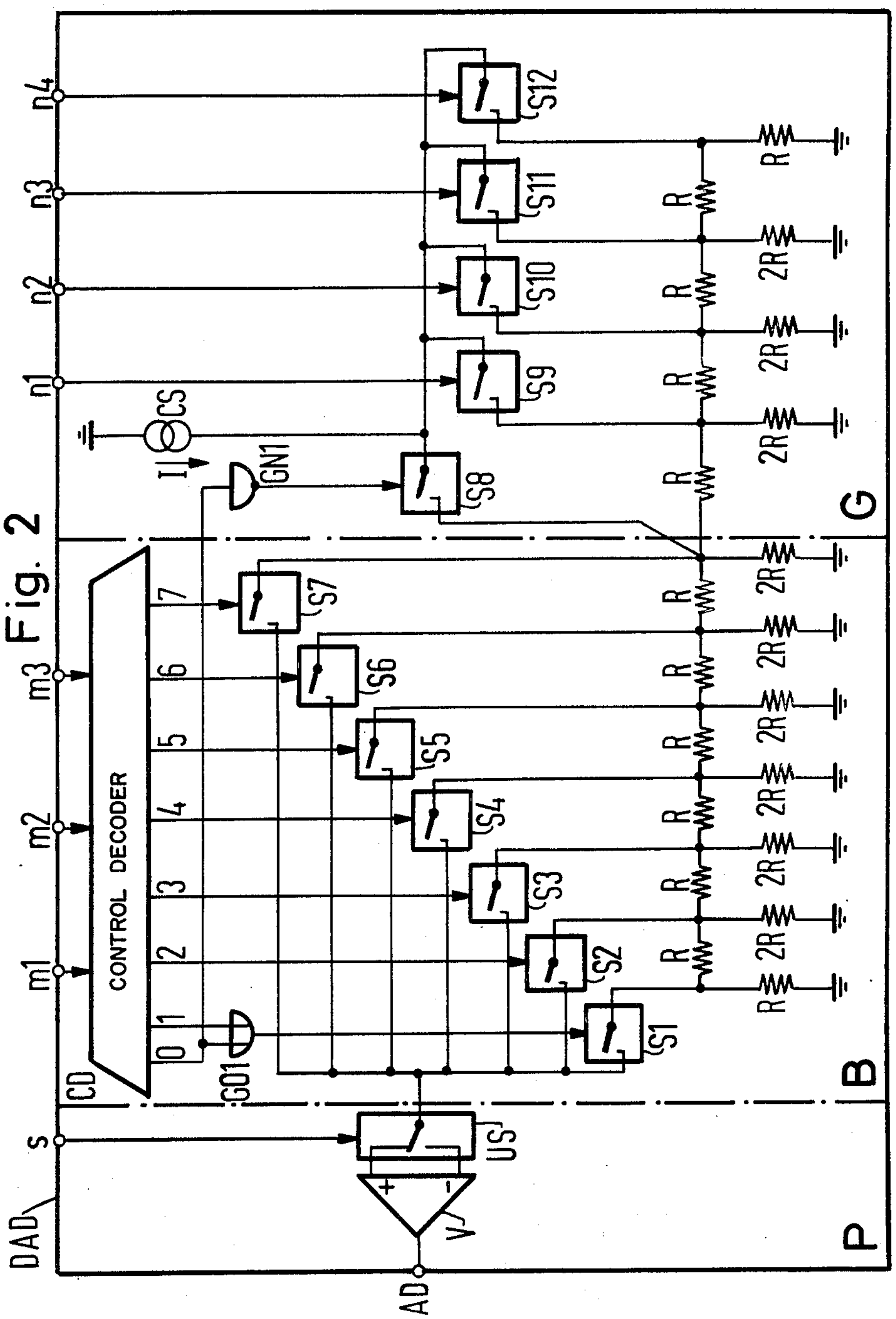
FIG. 2 is a detailed schematic diagram of a first embodiment of the digital-to-analog converter of the invention.

FIG. 2 shows further details of an embodiment of the digital-to-analog converter DAD provided in the circuit arrangement of FIG. 1. Like the digital-to-analog converter of FIG. 1, the digital-to-analog converter of FIG. 2 has inputs *s*, *m*1, *m*2, *m*3, *n*1, *n*2, *n*3, and *n*4, as well as an output AD. There appear at the aforesaid inputs, and in the prescribed sequence, the $1+m+n$ bits of the relevant digital signal (where *m* is 3 and *n* is 4) with decreasing significance. The digital-to-analog converter DAD itself comprises three decoder circuit components, viz. a first decoder circuit component G, a second decoder circuit component B, and a third decoder circuit component P.

The first decoder circuit component G and the second decoder circuit component B comprise a shared resistance ladder network, here provided in $\mu$ circuit, and all the shunt resistors thereof as well as the resistors disposed at both ends of the ladder networks have one and the same resistance value R. All the remaining resistors disposed in the leakage branches of the resistor-ladder network have the resistance value 2R. From the right end of the resistor-ladder network, as shown in FIG. 2, a group of N=4 neighboring junction points between one leakage resistor and at least one shunt resistor can be energized via switches S9, S10, S11, and S12 with constant current I from a constant-current source CS. The switches S9, S10, S11 and S12 are connected to their operating inputs at the inputs *n*1, *n*2, *n*3 or *n*4 of the digital-to-analog converter DAD, to which are fed the least significant n bits ($n=4$) of the digital signal concerned.

The junction point of the resistor-ladder network formed by one leakage resistor and at least one shunt resistor, and adjoining the junction points described above, can also be energized via a switch S8 with a constant current I from the constant-current source CS. The switch S8 can be actuated with its opening input via a NOT element GN1, which is connected to its input at an output 0 of a control decoder CD. The decoder CD is connected at the input end to the inputs *m*1, *m*2, and *m*3 of the digital-to-analog converter DAD, to which are fed the n bits of the next highest significance of the digital signal concerned. In addition to the aforesaid output 0, the control decoder CD has $2^m$ other outputs 1, 2, 3, 4, 5, 6, and 7 whereby any of the connected switches S1–S8 may be energized as selected by the m input bits to the decoder $CD_6$.

The operating input of a switch S1 is connected to the outputs 0 and 1 of the control decoder CD over an OR element GO1 and the operating inputs of other switches S2, S3, S4, S5, S6, and S7 are connected at the outputs 2 to 7 of the control decoder CD. The switches S1 to S7 are each connected with one terminal to a junction point of a corresponding number of junction points formed by one leakage resistor and at least one shunt resistor each of the resistor-ladder network of FIG. 2. The switch S7 is connected with its terminal to the junction point between leakage resistor and two shunt resistors of the resistor-ladder network at which the aforesaid switch S8 is connected. The switches S6 to S1 are connected at junction points of the resistor-ladder network which adjoin one another, starting from the junction point last mentioned. With their other terminals the switches S1 to S7 are connected at a terminal of a changeover switch US, which is connected with two outputs to corresponding inputs of amplifier V on the output end with the output AD of the digital-to-analog converter DAD. The changeover switch US, whose operating input is connected to input s of the digital-to-analog converter DAD and the amplifier V form the third decoder circuit component P of the digital-to-analog converter DAD. The remaining one bit of the relevant digital signal is routed to the input s. It determines the polarity of the analog signal transmitted from the digital-to-analog converter DAD.

After the above description of the construction of the digital-to-analog converter DAD depicted in FIG. 2, the mode of operation of it will now be described. The switches S9, S10, S11 or S12 are closed in accordance with the number of 1 bits appearing on the inputs *n*1 to *n*4 of the digital-to-analog converter DAD within the least significant n bits appearing on said inputs in the digital signal concerned. As a result, a constant current I from the constant-current source CS is fed to a corresponding number of the four junction points formed by one leakage resistor and at least one shunt resistor of the resistor-ladder network disposed in the right-hand portion of FIG. 2. The voltages occurring across the individual junction points as a result of such current feeds are added up, whereby the voltage occurring across a junction point on the junction points adjoining the junction point concerned is reduced by a factor of 2. In this connection, it is to be noted that although a single constant-current source CS is shown, it is contemplated that a constant current can also be fed from a separate constant-current source to each junction point formed by one leakage resistor and at least one shunt resistor which in certain circumstances is suitable for current feed.

The control decoder CD transmits an output signal from one of its eitht outputs 0 to 7 to close one of the switches S1 to S7 according to the number of 1 bits of the digital signal appearing on the inputs m*l*, m2, and *m*3 of the digital-to-analog converter DAD. Accordingly, one of the seven junction points adjoining the previously described junction points formed by one leakage resistor and at least one shunt resistor each of resistor-ladder network is connected to the input of the changeover switch US and, thus, to the ouput AD of the digital-to-analog converter DAD.

Due to its construction and mode of operation, the digital-to-analog converter described hereinabove has a non-linear characteristic consisting of $2^{m+1}=16$ linear segments of $2^n=16$ amplitude stages each. Since, as will be explained further below, the two first segments at both sides of the origin of coordinates of a coordinate system in which the characteristic is situated together form only one segment, there are actually only 13 linear segments. The slopes of linear segments that adjoin one another differ from one another by a factor of 2.

Like the digital-to-analog converter shown in FIG. 2, the digital-to-analog converter DAD depicted in FIG.

3 has inputs $s$, $m1$, $m2$, $m3$, $n1$, $n2$, $n3$, and $n4$, as well as an output AD. As in FIG. 2, a resistor-ladder network of integrated circuit construction is, likewise, provided in the digital-to-analog converter DAD of FIG. 3, whose shunt resistors and the resistors disposed at both ends of the ladder network have a resistance value of R each, while all the other leakage resistors have a resistance value of 2R. However, in contradistinction to the conditions shown in FIG. 2, the ranges for the first decoder circuit element G and the second decoder circuit element B are not fixed in the digital-to-analog converter of FIG. 3, but they vary or move in accordance with the m bits of the digital signal concerned. With the exception of the junction point disposed at one end of the resistor-ladder network, $n$=4 neighboring junction points at a time formed by one shunt resistor and a leakage resistor each of the resistor-ladder network are connected with a corresponding group of four switches of a network comprising a great number of switches. The network of switches comprises the switches S21 to S27, S31 to S37, S41 to S47, and S51 to S57 which, like all the other switches, may be electronic switches. Of the aforementioned switches, the switches S27, S37, S47, and S57, which to some extent form a group of switches, are connected with the four rightmost neighboring junction points formed by one leakage resistor and at least one shunt resistor each of the resistor-ladder network. Similarly, the four switches S21, S31, S41, and S51, which likewise form a group of switches, are connected with four successive junction points formed by one leakage resistor and two shunt resistors each of the resistor-ladder network, whereby one junction point is adjacent to said one end of the resistor-ladder network.

To the switches that form a group, such as the switches S21, S31, S41, and S51, there belong a further switch, such as the switch S11. One terminal of these switches, of the group to which the switches S11 to S17 belong, is connected to the junction point adjoining group concerned of four adjacent junction points formed by one leakage resistor and at least one shunt resistor of the resistor-ladder network each, to be more precise, on the side on which said one end of the resistor-ladder network is disposed. Thus, for example, one terminal of the switch S17 is connected to a junction point between one leakage resistor and two shunt resistors of the resistor-ladder network, said junction point adjoining four junction points, with which one terminal of the switches S27, S37, S47, and S57 is connected.

Figure 3:
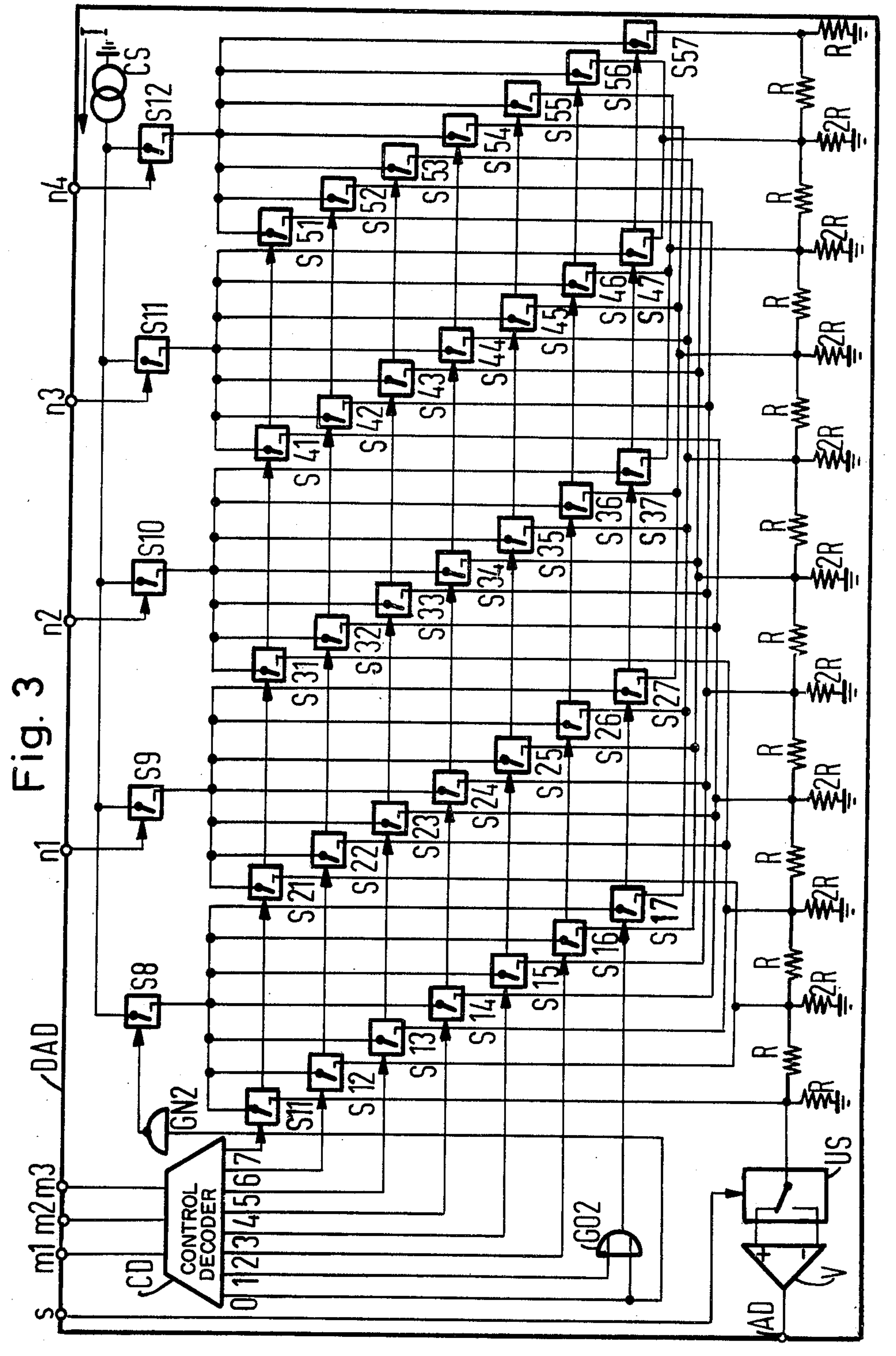
FIG. 3 is a detailed schematic diagram of a second embodiment of the digital-to-analog converter of the invention.

As shown in FIG. 3, the switches that form a group of switches are controlled from corresponding outputs 0, 1, 2, 3, 4, 5, 6, or 7 of a control decoder DC, having inputs m1, m2, and m3. As a function of the bits of the digital signal in question which are disposed on the three inputs m1, m2, and m3, the control decoder CD transmits on one of its eight outputs a signal for closing corresponding switches. The outputs 0 and 1 of the control decoder CD are combined over an OR element GO2. There is further connected to the output 0 of the control decoder CD the input of a NOT element GN2, which is connected at its output to the control input of a switch S8, which in turn is connected to one terminal of the switches S11 to S17 and which is connected with its other terminal to a constant-current source CS. One terminal of other switches S9, S10, S11, and S12 are connected at the constant-current source CS. The other terminals of these switches S9, S10, S11, and S12 are connected to one terminal of the switches S21 to S27 or S31 to S37 or S41 to S47 or S51 to S57. The operating inputs of the switches S9, S10, S11, and S12 are connected to the inputs $n1$, $n2$, $n3$, and $n4$.

The changeover input of a changeover switch US is connected at one end of the resistor-ladder network in FIG. 3, i.e., the left end of the resistor-ladder network. The outputs of the changeover switch US are connected to two inputs of amplifier V, which is connected at its input to the output terminal AD of the digital-to-analog converter DAD. The control input of the changeover switch US is connected to the inputs s of the digital-to-analog converter DAD. Depending on the switch position of the changeover switch US, the amplifier transmits from its output and, therefore, from the output AD of the digital-to-analog converter DAD the fed signal in a negated or non-negated form.

After describing the construction of the digital-to-analog converter of FIG. 3, its mode of operation will now be described. For this purpose, let it first be assumed that the four least significant bits of a digital signal comprising eight bits (i.e., the bits appearing as the inputs $n1$, $n2$, $n3$ and $n4$) are each formed by a binary 1. Let it further be assumed that a binary 1 is also present at the input $m1$. Thus, the control decoder DC CD a control signal from its output 1, which causes the closing of the switches S17, S27, S37, S47, and S57 over the OR element GO2. This leads also to the closing of the switch S8, since a corresponding operating signal is routed to its operating input. In this way, the five neighboring junctions points formed by one leakage resistor and at least one shunt resistor each and disposed on the right side of the resistor-ladder network as shown in FIG. 3 are fed with a constant current from the constant-current source CS.

Once it is assumed that a binary 1 is applied at each of the inputs $n1$, $n2$, $n3$, and $n4$, and further that a binary 1 is applied at each of the three inputs $m1$, $m2$, and $m3$, then the control decoder CD transmits from its output 7 an operating signal, so as to operate the switches S11, S21, S31, S41, and S51, which form a group of switches. In this way, the four junction points formed by one leakage resistor and two shunt resistors each and adjoining said one end at which the changeover switch US is connected, are fed with a constant current I from the constant-current source CS over the closed switches S9, S10, S11 or S12, and the closed switches S21, S31, S41, or S51. Moreover, the junction point that forms the one end of resistor-ladder network and is formed by one leakage resistor and one shunt resistor is fed with a constant current I. It is clear from the foregoing that the one junction point of the $n$=4 neighboring junction points turned toward said one end at which the input of the changeover switch US is connected has a distance corresponding to 1 to $2^m$=1 junction points from the one end concerned.

With regard to the digital-to-analog converter described hereinabove, it is also to be noted that because of its construction and mode of operation it has a non-linear characteristic such as possessed by the digital-to-analog converter depicted in FIG. 2, i.e., a characteristic that actually comprises 13 linear segments, whose neighboring segments have slopes that differ from one another by a factor of 2.

The following is also to be noted with regard to the characteristic with 13 linear segments of the two digital-to-analog converters as shown in FIGS. 2 and 3 above. Because a constant current I is fed into a junction point adjoining the $n$ adjacent junction points formed by one leakage resistor ans at least one shunt resistor each, a constant voltate is added to the output signal of the first decoder circuit element. Once one starts from the original $2^{m+1}$ available linear segments of the characteristic, from the originally second linear segment from the origin of coordinates of the coordinate system in which the characteristic is situated, the originally second linear segment of the characteristic immediately follows the originally first segment of the characteristic. In this way, the four segments of the characteristic that lie immediately around the origin of coordinates actually form a single linear segment. For this purpose, the two outputs 0 and 1 of the control decoder CD provided in each case are also combined over the OR element GO1 or GO2. The other linear segments of the characteristic immediately follow the single linear segment thus formed and running through the origin of coordinates of said coordinate system, such that the slopes of neighboring segments differ from one another by the factor of 2.

The preferred embodiments described hereinabove are intended only to be exemplary of the principles of the invention. It is contemplated that the described embodiments can be modified or changed while remaining within the scope of the invention, as defined by the appended claims.

We claim:

1. In a digital-to-analog converter for converting digital signals comprising $n+m+1$ bits each to analog signals with a non-linear characteristic consisting of $2^{m+1}$ linear segments, having $2^n$ amplitude stages comprising a coder operating according to the iterative process through the use of a first decoder circuit element, a second decoder circuit element and a third decoder circuit element, the first decoder circuit elements converting $n$ bits of the digital signal in a resistor-ladder network having resistors that are adequate for a binay staggering of values to an analog control signal for the second decoder circuit element, the resistor-ladder network of the first decoder circuit element including a further resistor which can be made operative in the event that at least one of the $m$ bits of the digital signal is formed by a binary 1, the second decoder circuit element comprising a resistor-ladder network having resistors that are adequate for a binary staggering of values, said resistors being made operative according to the value of the $m$ binary bits of the digital signal and by said control signal, and the third decoder circuit element fixing the polarity of an output signal to be transmitted from the second decoder circuit element to a decoder output according to the remaining one bit in the digital signal, the improvement comprising:

a common resistance ladder network shared by said first and second decoder elements wherein all shunt and end resistances have substantially one and the same resistance value, all remaining resistances being of twice said one value, constant current source means connected to $n$ adjacent junction points formed by one of said remaining resistances and at least one said shunt resistance each, said $n$ junction points being energized in accordance with $n$ binary one bits of said digital signal, a second junction point adjoining said n junction points and formed by one of said remaining resistances and two of said shunt resistances, said second junction point being connected to be energized by said constant current in the event that at least one of m bits of the data signal is a binary one, means for selectively connecting an output of said converter between one of said remaining resistances and at least one of said shunt resistances with one $2^m-1$ junction points adjoining said junction points, said one junction point being determined by the value of the $m$ binary one bits of the digital signal.

2. The digital-to-analog converter as defined in claim 1, wherein the polarities of said constant currents are determined by the remaining one bit of the digital signal concerned.

3. The digital-to-analog converter as defined in claim 1, wherein there is inserted intermediate said converter output and said resistance ladder network a change-over stage which transmits the signal routed thereto with one or another polarity as a function of the value of the remaining one bit of the digital signal.

4. In a digital-to-analog converter for converting digital signal comprising $n+m+1$ bits each to analog signals with a non-linear characteristic comprising $2^{m+1}$ linear segments having $2^n$ amplitude stages comprising a coder operating according to the iterative process through the use of a first decoder circuit element, a second decoder circuit element, and a third decoder circuit element, the first decoder circuit element converting the n bits of the digital signal in a resistor-ladder network, having resistors that are adequate for a binary staggering of values, to an analog control signal for the second decoder circuit element, the resistor-ladder network of the first decoder circuit element including a further resistor which can be made operative in the event that at least one of the m bits of the signal if formed by a binary one, the second decoder circuit element comprising a resistor-ladder network having resistors that are adequate for a binary staggering of values, said resistors being made operative in accordance with the value of the m binary bits of the digital signal and affecting said control signal accordingly, and the third decoder circuit element fixing the polarity of an output signal to be transmitted from the second decoder circuit element to a decoder output according to the remaining one bit, the improvement comprising:

common resistance ladder network means, shared by said first and second decoder elements, having shunt resistances and resistances disposed at both ends of said ladder network, each of said shunt and end resistances having substantially one and the same resistance value, all remaining resistances in said ladder network having twice said one value, one end of said ladder network being connected to an output of said converter, a group of $n$ neighboring junction points being formed on said ladder network, each junction point being defined by one of said remaining resistances and at least one of said shunt resistances, one of said junction points of said group turned toward said one end of said ladder network has a distance from said one end corresponding to 1 to $2^{m-1}$ junction points in accordance with the value of the m binary one bits of said digital signal, constant current source means selectively connectable to ones of said group of junction points according to the $n$ binary one bits of said digital signal, and means connecting said constant current source means to a junction between one of said remaining resistance means and a shunt resistance means adjoining said n neighboring junctions in the event that at least one of the *m* bits of said digital signal is a binary one.

5. The digital-to-analog converter as defined in claim 4, wherein said constant current source means is connected to the junction points formed by one said remaining resistance and at least one shunt resistance each over a switch network containing a multiplicity of switches, which can each be triggered from an output of a control decoder having $2^m$ outputs, to which the *m* bits of the digital signal concerned are routed.

* * * * *